(12) United States Patent
Yang et al.

(10) Patent No.: US 7,026,851 B2
(45) Date of Patent: Apr. 11, 2006

(54) PWM CONTROLLER HAVING FREQUENCY JITTER FOR POWER SUPPLIES

(75) Inventors: Ta-yung Yang, Milpitas, CA (US); Guo-Kiang Hung, Sindian (TW); Song-Yi Lin, Taipei (TW)

(73) Assignee: System General Corp., Taipei Hsien (TW)

( * ) Notice: Subject to any disclaimer, the term of this patent is extended or adjusted under 35 U.S.C. 154(b) by 16 days.

(21) Appl. No.: 10/844,677

(22) Filed: May 12, 2004

(65) Prior Publication Data

US 2005/0253636 A1    Nov. 17, 2005

(51) Int. Cl.
    *H03K 3/017*    (2006.01)
(52) U.S. Cl. ....................... 327/172; 327/175
(58) Field of Classification Search .................. None
    See application file for complete search history.

(56) References Cited

U.S. PATENT DOCUMENTS 6,218,820 B1 *  4/2001  D'Arrigo et al. ........... 323/285
6,768,657 B1 *  7/2004  Yang et al. .................... 363/41
6,839,247 B1 *  1/2005  Yang et al. ............... 363/21.11

* cited by examiner

*Primary Examiner*—Kenneth B. Wells
*Assistant Examiner*—Cassandra Cox
(74) *Attorney, Agent, or Firm*—J.C. Patents

(57) ABSTRACT

A PWM controller having frequency jitter includes a modulator for generating a first jitter current and a second jitter current. An oscillator generates a pulse signal for producing a switching frequency in response to the modulation of the first jitter current. An attenuator is connected in a voltage feedback loop for attenuating a feedback signal to an attenuated feedback signal, in which the attenuated feedback signal is utilized to control an on-time of a switching signal. A variable-resistance circuit is connected with the attenuator for programming an attenuation rate of the attenuator in response to the modulation of the second jitter current. The switching frequency increases whenever the first jitter current increases. Meanwhile, the impedance of the attenuator will decreases and the attenuation rate will increase whenever the second jitter current increase. The on-time of the switching signal is thus immediately reduced, which compensates the decrease of the switching period and keeps the output power as a constant.

17 Claims, 6 Drawing Sheets

PWM CONTROLLER HAVING FREQUENCY JITTER FOR POWER SUPPLIES

BACKGROUND OF THE INVENTION

1. Field of the Invention

The present invention relates to a power supply and more specifically relates to PWM control of a switching mode power supply.

2. Description of Related Art

Power supplies have been used to convert an unregulated power source to a regulated voltage or current. FIG. 1 shows a traditional power supply, in which a PWM controller 10 generates a switching signal for switching a transformer 11 via a transistor 20. The duty cycle of the switching signal determines the power delivered from an input of the power source to an output of the power supply. Although the switching technology reduces the size of the power converter, switching devices generate electric and magnetic interference (EMI) that interferes the power source. An EMI filter 15 equipped at an input of the power supply is utilized to resist the EMI into the input of the power source. However, the EMI filter 15 used to reduce the EMI causes power consumption and increases the cost and the size of the power supply. In recent development, many prior arts have been proposed to reduce the EMI by using frequency jitter. They are, "Effects of switching frequency modulation on EMI performance of a converter using spread spectrum approach" by M. Rahkala, T. Suntio, K. Kalliomaki, APEC 2002 (Applied Power Electronics Conference and Exposition, 2002), 17-Annual, IEEE, Volume 1, 10–14, Mar., 2002, Pages: 93–99; "Offline converter with integrated softstart and frequency jitter" by Balu Balakirshnan, Alex Djenguerian, U.S. Pat. No. 6,229,366, May 8, 2001; and "Frequency jittering control for varying the switching frequency of a power supply" by Balu Balakirshnan, Alex Djenguerian, U.S. Pat. No. 6,249,876, Jun. 19, 2001. However, the disadvantage of these prior arts is that the frequency jitter generates undesired ripple signal at the power supply outputs. The undesired ripple signal generated by the frequency jitter could be realized as following description. An output power $P_O$ of the power supply is the product of an output voltage $V_O$ and an output current $I_O$, which is given by, $$P_O = V_O \times I_O = \eta \times P_{IN} \qquad (1)$$

An input power $P_{IN}$ of the transformer 11 and a switching current $I_P$ can be respectively expressed as, $$P_{IN} = \frac{1}{2 \times T} \times L_P \times I_P^2$$

$$I_P = \frac{V_{IN}}{L_P} \times T_{ON}$$

Where $\eta$ is the efficiency the transformer; $V_{IN}$ is the input voltage; $L_P$ is the primary inductance of the transformer 11; T is the switching period of the switching signal; $T_{ON}$ is the on-time of the switching signal.

The equation (1) can be rewritten as, $$P_O = \eta \times \frac{V_{IN}^2 \times T_{ON}^2}{2 \times L_P \times T} \qquad (2)$$

The switching period T varies in response to the frequency jitter. As shown in equation (2), the output power $P_O$ will vary in response to the variation of the switching period T. The variation of the output power $P_O$ therefore generates an undesired ripple signal.

An object of the present invention is to provide a PWM controller having frequency jitter to reduce the EMI for power supply. The frequency jitter will not generate the ripple signal at the power supply outputs. Another object of the present invention is to reduce the complexity and the cost of the circuit that generates the frequency jitter.

SUMMARY OF THE INVENTION

A PWM controller having frequency jitter for power supplies according to an embodiment of the present invention includes a modulator, an oscillator, an attenuator, a variable-resistance circuit, a first comparator, a second comparator, a D flip-flop, a first AND gate, a second AND gate, a current source and an inverter. The modulator generates a first jitter current and a second jitter current. The oscillator generates a pulse signal to produce a switching frequency in response to the modulation of the first jitter current. The attenuator is connected in a voltage feedback loop for attenuating a feedback signal to an attenuated feedback signal. The attenuated feedback signal is utilized to control an on-time of a switching signal. The variable-resistance circuit is connected with the attenuator for programming an attenuation rate of the attenuator in response to the modulation of the second jitter current. The first comparator generates a first reset signal and the second comparator generates a second reset signal. The second AND gate associated a PWM signal and an inverse pulse signal to generate the switching signal.

A switching current of a transformer generates a switching-current signal across a sense resistor. The first comparator generates the first reset signal when the switching-current signal exceeds the attenuated feedback signal. The second comparator compares the switching-current signal with a threshold voltage for over-current protection. The D flip-flop outputs the PWM signal, which is set by the pulse signal and is reset by the first reset signal and the second reset signal through the first AND gate.

Both the first jitter current and the second jitter current are in triangle waveform. The switching frequency increases wherever the first jitter current increases, and vice versa. Therefore the switching frequency is modulated in response to the first jitter current. Meanwhile, the impedance of the attenuator decreases and the attenuation rate increases whenever the second jitter current increases. Therefore, the on-time of the switching signal is immediately reduced, which compensates the decrease of the switching period and keeps the output power as a constant. Since the on-time of the switching signal is feed-forward compensated in response to frequency jittering, undesired ripple signal can be eliminated.

Furthermore, the charge and the discharge of the triangle waveform are sliced enabled by the pulse signal. This can reduce the size of the modulator circuit.

It is to be understood that both the foregoing general descriptions and the following detailed descriptions are exemplary, and are intended to provide further explanation of the invention as claimed. Still further objects and advantages will become apparent from a consideration of the ensuing description and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
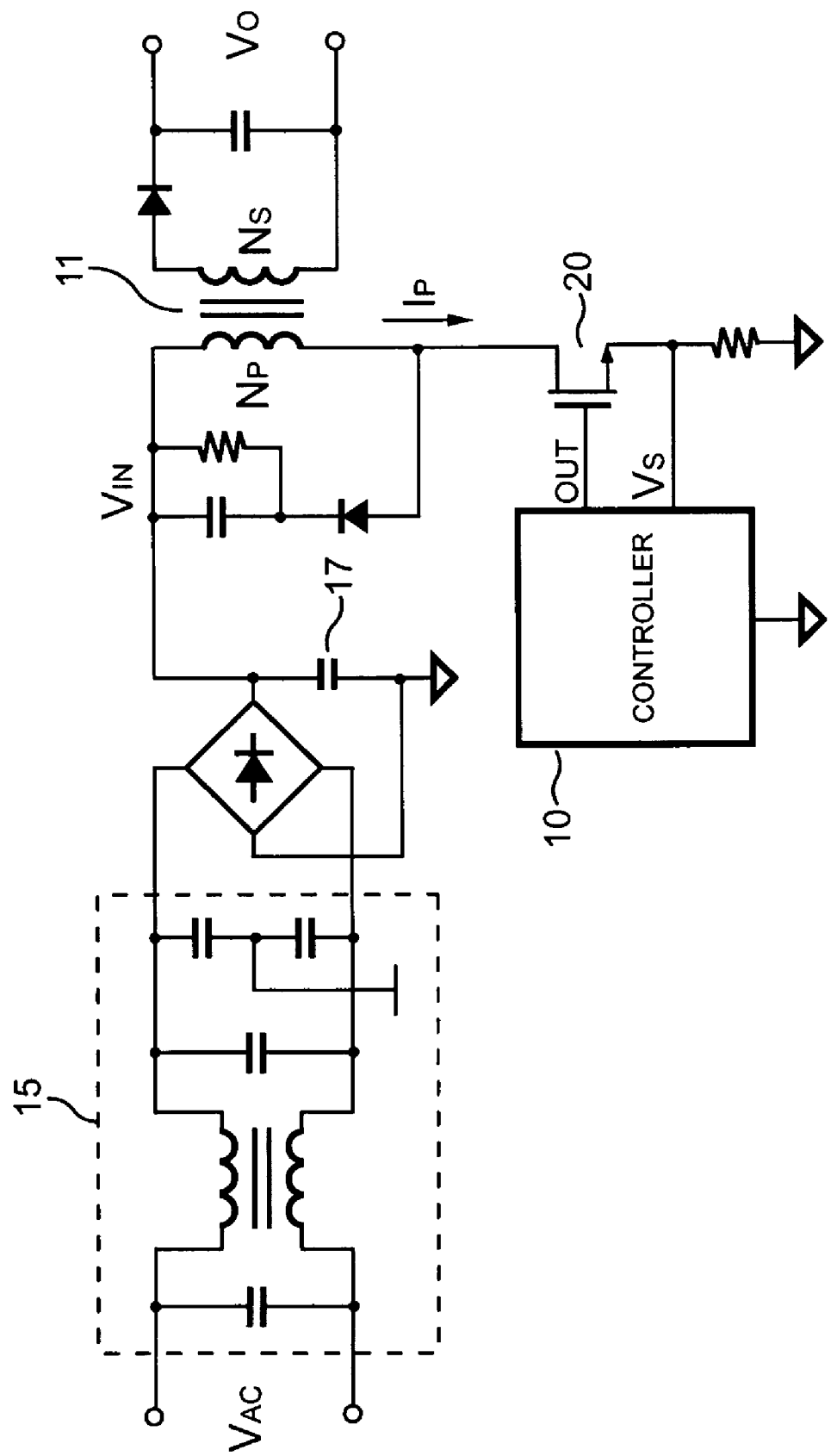
FIG. 1 shows a traditional power supply with EMI filter.
Figure 2:
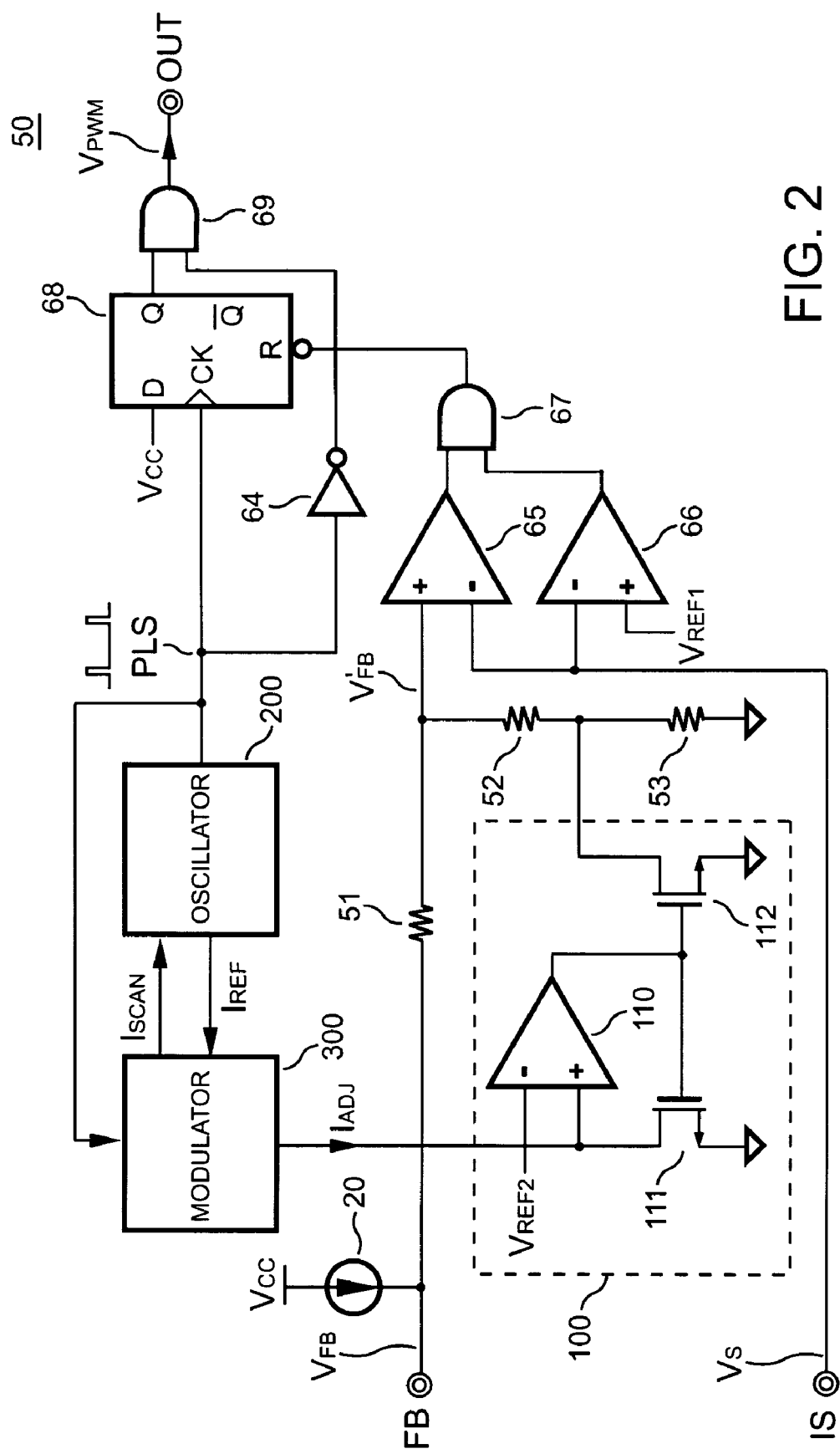
FIG. 2 shows an embodiment of a PWM controller having frequency jitter according to the present invention.

FIG. 2 is a circuit schematic of a PWM controller 50 having frequency jitter according to an embodiment of the present invention. The PWM controller 50 includes a modulator 300, an oscillator 200, a variable-resistance circuit 100, a first comparator 65 and a second comparator 66, a D flip-flop 68, an inverter 64, two AND gates 67, 69, and an attenuator formed by resistors 51, 52 and 53. In response to a pulse signal PLS and a reference current $I_{REF}$ generated by the oscillator 200, the modulator 300 generates a first jitter current $I_{SCAN}$ and a second jitter current $I_{ADJ}$. The first jitter current $I_{SCAN}$ is proportional to the second jitter current $I_{ADJ}$.

The first jitter current $I_{SCAN}$ and the second jitter current $I_{ADJ}$ are in triangle waveform. The oscillator 200 generates the pulse signal PLS for determining a switching frequency in response to the modulation of the first jitter current $I_{SCAN}$. The switching frequency increases whenever the first jitter current $I_{SCAN}$ increases, and vice versa.

Resistors 51, 52 and 53 form an attenuator for attenuating a feedback signal $V_{FB}$ into an attenuated feedback voltage $V'_{FB}$. The attenuated feedback signal $V'_{FB}$ is utilized to control an on-time of a switching signal $V_{PWM}$. The resistor 51 is connected from a feedback input FB to a positive input of the first comparator 65. The resistor 52 and the resistor 53 are connected in series from the positive input of the first comparator 65 to a ground reference level. An output of the variable-resistance circuit 100 is connected in parallel with the resistor 53 for programming an attenuation rate of the attenuator in response to the modulation of the second jitter current $I_{ADJ}$. The on-time of the switching signal $V_{PWM}$ is inversely proportional to the second jitter current $I_{ADJ}$.

Figure 7:
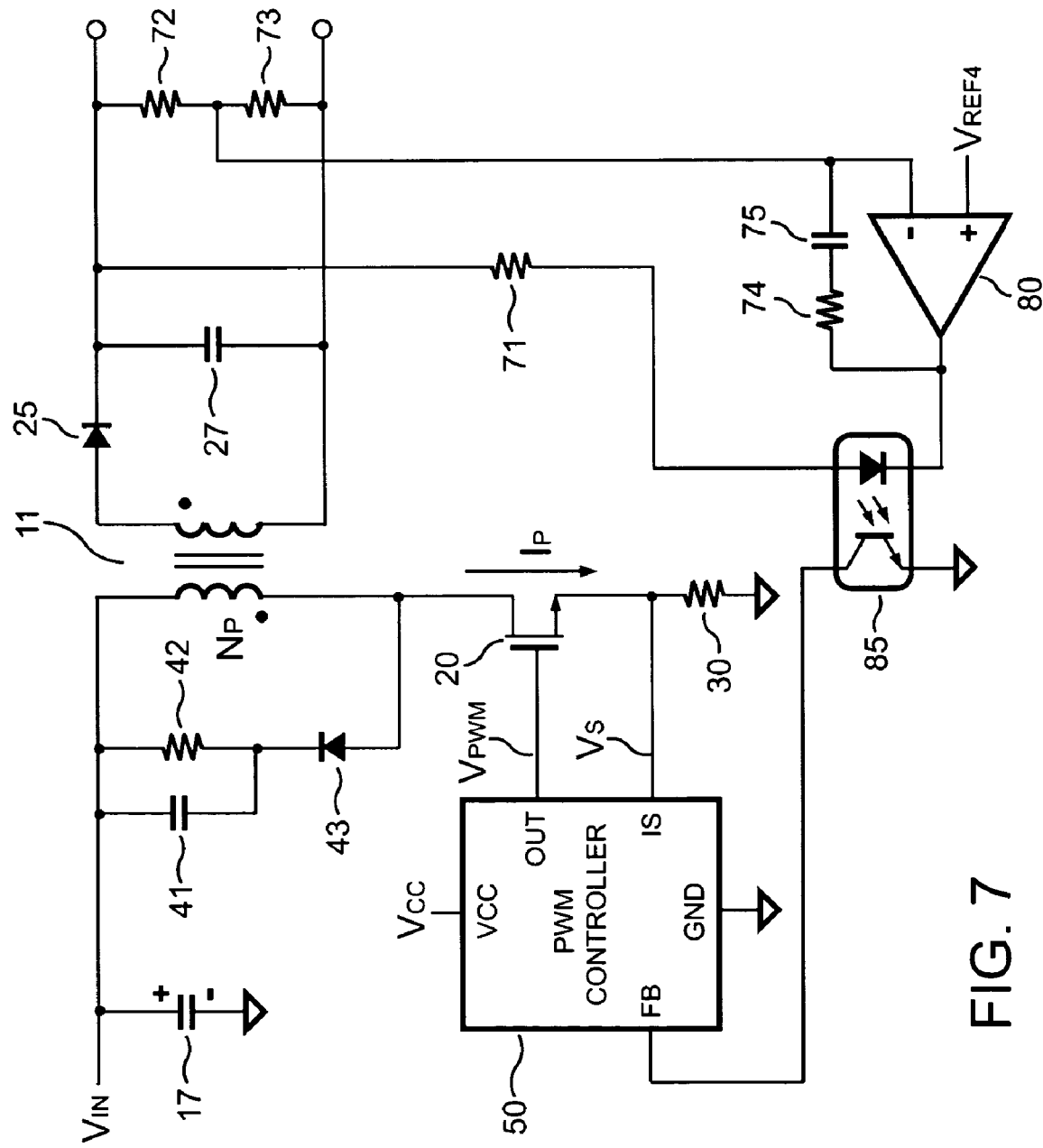
FIG. 7 shows an embodiment of a power supply using the PWM controller according to the present invention.

A negative input of the first comparator 65 and a negative input of the second comparator 66 are both connected to a current-sense input IS. As shown in FIG. 7, a switching current $I_P$ of a transformer 11 is converted to a switching-current signal $V_S$ through a sense resistor 30. The switching-current signal $V_S$ is supplied to the current-sense input IS. The first comparator 65 generates a first reset signal when the switching-current signal $V_S$ exceeds the attenuated feedback signal $V'_{FB}$. The second comparator 66 compares the switching-current signal $V_S$ with a threshold voltage $V_{REF1}$ for over-current protection. Once the switching-current signal $V_S$ exceeds the threshold voltage $V_{REF1}$, the second comparator 66 will generate a second reset signal immediately. The D flip-flop 68 is set by the pulse signal PLS and is reset by the first reset signal and the second reset signal via the AND gate 67. An output of the D flip-flop 68 generates a PWM signal. The PWM signal is supplied to a first input of the AND gate 69. A second input of the AND gate 69 is connected to an output of the inverter 64. The pulse signal PLS is supplied to an input of the inverter 64. The switching signal $V_{PWM}$ is generated from an output of the AND gate 69.

The switching frequency is modulated in response to the first jitter current $I_{SCAN}$. Meanwhile, when the second jitter current $I_{ADJ}$ increases, the impedance of the variable resistance circuit 100 will decrease and the attenuation rate of the attenuator of the attenuator will increase. The on-time of the switching signal $V_{PWM}$ is thus immediately reduced, which compensates the decrease of the switching period and keeps the output power as a constant. Since the on-time of the switching signal $V_{PWM}$ is feed-forward compensated in response to the frequency jitter, which eliminates undesired ripple signal.

The variable-resistance circuit 100 comprises an operational amplifier 110 and two transistors 111 and 112. A negative input of the operational amplifier 110 is supplied with a reference voltage $V_{REF2}$. The second jitter current $I_{ADJ}$ is supplied to a positive input of the operational amplifier 110 and a drain of the transistor 111. The sources of transistors 111 and 112 are connected to the ground reference level. The gates of the transistors 111 and 112 are controlled by an output of the operational amplifier 110. A drain of the transistor 112 is the output of the variable resistance circuit 100, which is connected in parallel with the resistor 53.

Both transistors 111 and 112 are MOSFET and operated in linear region. The characteristic of a MOSFET operated in linear region is a resistor. Such equivalent resistor in linear region is more precise than that designed by W/L sheet resistance. The variation of a resistor designed inside the integrated circuit is about ±30% by using W/L and sheet resistance. And it is easy to design a precise constant voltage and a precise constant current inside the integrated circuit. The following equations are the characteristic description of the transistor 111.

$$I = K \times [(V_{GS} - V_T) \times V_{DS} - (\tfrac{1}{2} \times V_{DS}^2)] \qquad (3)$$

In the above equation, $K = \delta(W/L)$, $\delta$ is the product of the mobility and oxide capacitance/unit. $V_T$ is the gate threshold voltage. $V_{GS}$ is the gate-to-source voltage. $V_{DS}$ is the drain-to-source voltage. From the equation (3), it is deduced that $$R_{DS} = \frac{V_{DS}}{I_{DS}} = \frac{1}{K \times \left[(V_{GS} - V_T) - \left(\tfrac{1}{2} \times V_{DS}\right)\right]} \qquad (4)$$

In the linear region, $(V_{GS} - V_T)$ is greater than $V_{DS}$. $R_{DS}$ is the equivalent drain-to-source resistance of a MOSFET. By assuming $V_{GS} - V_T \gg V_{DS}$ and introducing $K = \delta(W/L)$, the equation (4) can be represented as following equation.

$$R_{DS} = \frac{L}{[W \times \delta \times (V_{GS} - V_T)]} \qquad (5)$$

For example, when $L/W = 2.7$, $V_{GS} = 4V$, $V_T = 0.7V$, and $\delta = 45$ uA/V, the resistor $R_{DS}$ will be 18 KΩ. Under the variance of production process, operational temperature, the deviation of $V_T$ and $\delta$ will be reduced by the gain of the operational amplifier 110.

The transistor 112 operates as a resistor that is mirrored by the transistor 111. The operation current of the transistor 112 equals to the second jitter current $I_{ADJ}$. Through the control of the operational amplifier 110, the transistor 111 plays the role of an equivalent resistor. The resistor value of the equivalent resistor can be expressed as, $$R_{DS} = \frac{V_{REF2}}{I_{ADJ}} \tag{6}$$

The gate-to-source voltage $V_{GS}$ of the transistor 112 equals to that of the transistor 111. Since the transistor 112 operates as a mirrored resistor of the transistor 111, the resistance of the mirrored resistor will decrease whenever the second jitter current $I_{ADJ}$ increases.

Figure 3:
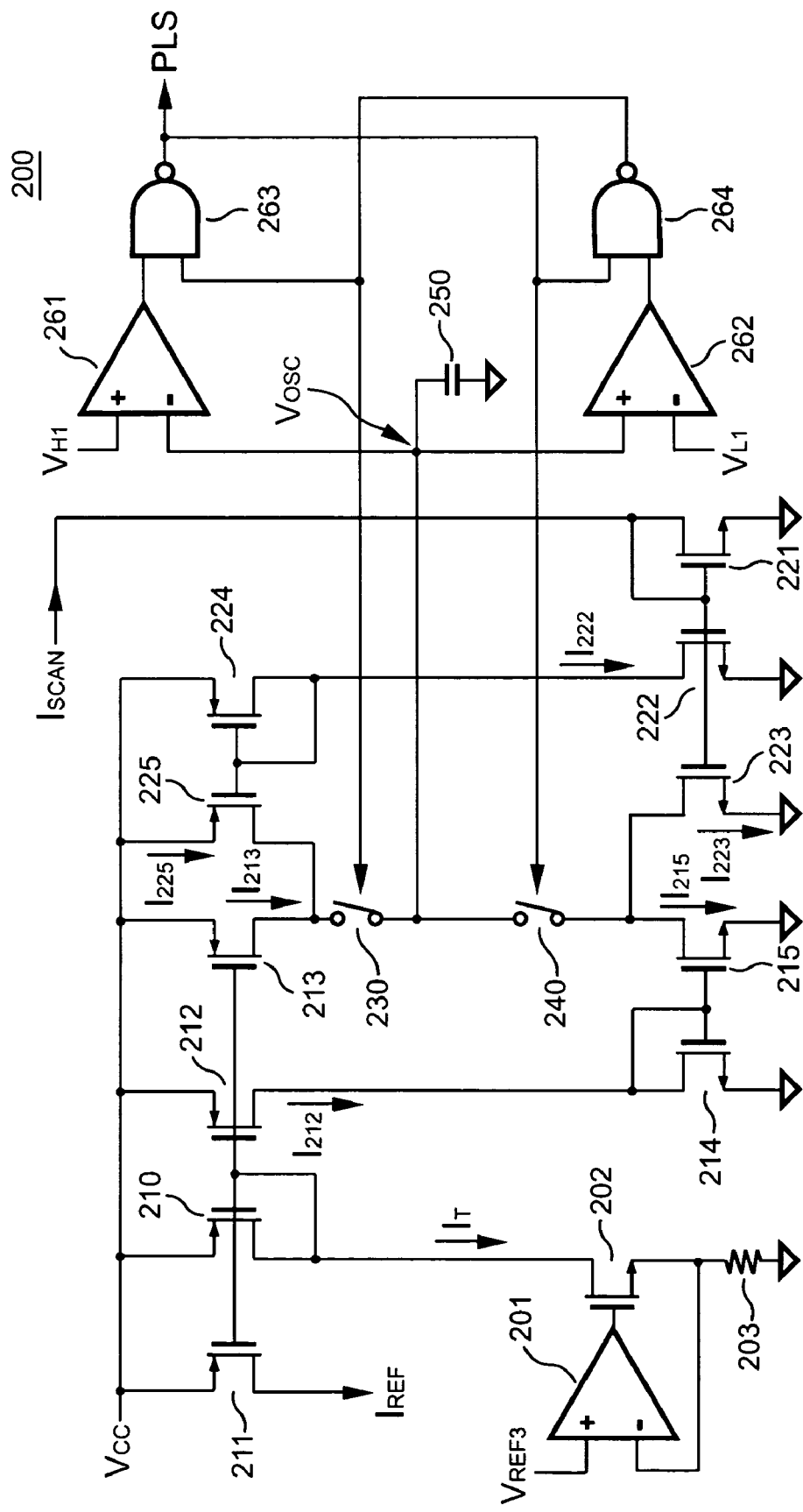
FIG. 3 shows an embodiment of an oscillator according to the present invention.

As shown in FIG. 3, the oscillator 200 comprises a first V-to-I circuit, which is built by an operational amplifier 201, a transistor 202 and a resistor 203 to generate a constant current $I_T$. The oscillator 200 further comprises a first current mirror, a second current mirror, a third current mirror, and a fourth current mirror. Transistors 210, 211, 212 and 213 form the first current mirror. The constant current $I_T$ mirrors a reference current $I_{REF}$, a current $I_{212}$ and a current $I_{213}$ through transistors 211, 212 and 213 respectively.

Transistors 214 and 215 form the second current mirror. The current $I_{212}$ further drives the second current mirror for generating a current $I_{215}$ via the transistor 215. Transistors 221, 222 and 223 form a third current mirror. The first jitter current $I_{SCAN}$ drives the third current mirror to generate a current $I_{222}$ and a current $I_{223}$. Transistors 224 and 225 form a fourth current mirror. The current $I_{222}$ drives the fourth current mirror to generate a current $I_{225}$ via the transistor 225. The current $I_{213}$ and the current $I_{225}$ are applied to charge a capacitor 250 via a switch 230. The current $I_{215}$ and the current $I_{223}$ are applied to discharge the capacitor 250 via a switch 240. A negative input of a comparator 261 and a positive input of a comparator 262 are connected to the capacitor 250. A positive input of a comparator 261 is supplied with a threshold voltage $V_{H1}$. A negative input of a comparator 262 is supplied with a threshold voltage $V_{L1}$. The threshold voltage $V_{H1}$ is higher than the threshold voltage $V_{L1}$. An output of the comparator 261 is connected to a first input of a NAND gate 263. An output of the comparator 262 is connected to a first input of a NAND gate 264. The NAND gate 263 outputs the pulse signal PLS, which is supplied to a second input of the NAND gate 264 and a control terminal of the switch 240. An output of the NAND gate 264 is connected to a second input of the NAND gate 263 and a control terminal of the switch 230.

When a voltage $V_{OSC}$ across the capacitor 250 is higher than the threshold voltage $V_{H1}$, the pulse signal PLS will be active. When the pulse signal PLS becomes logic-high, the switch 230 will be turned off and the switch 240 will be turned on for discharging the capacitor 250. Once the capacitor 250 is discharged and the voltage $V_{OSC}$ is lower than the threshold voltage $V_{L1}$, the pulse signal PLS will be pulled low to start the next switching cycle and charge the capacitor 250.

Figure 5:
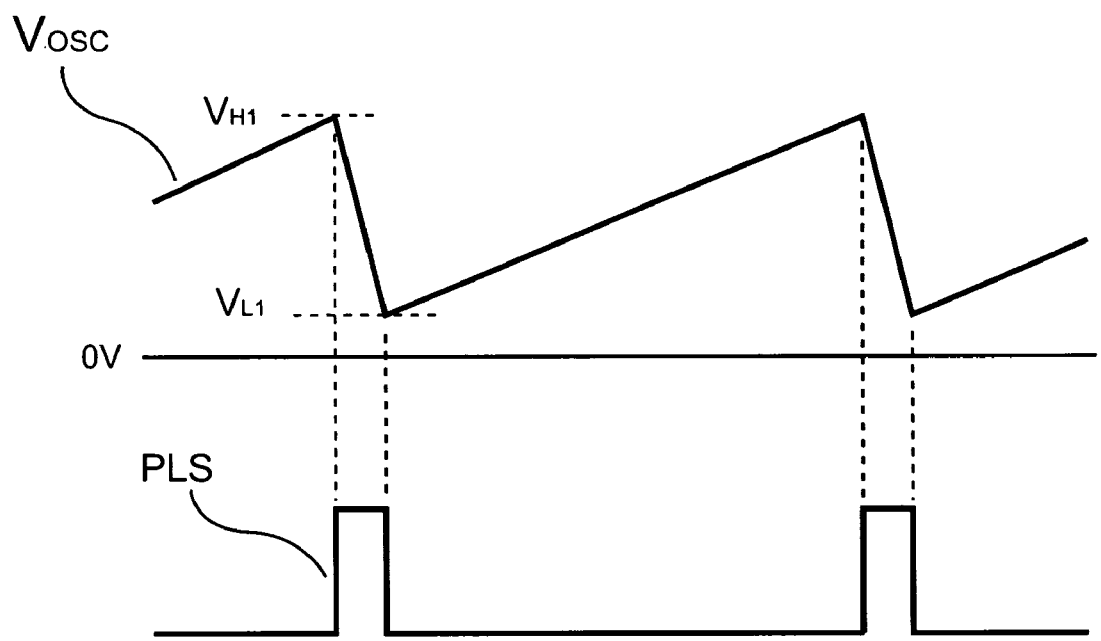
FIG. 5 shows the waveform of the oscillator.

FIG. 5 shows the waveforms for the voltage $V_{OSC}$ and the pulse signal PLS. The threshold voltages $V_{H1}$ and $V_{L1}$, the capacitance of the capacitor 250, the currents $I_{213}$ and $I_{225}$, the currents $I_{215}$ and $I_{223}$ determine the switching frequency. Since the current $I_{225}$ and the current $I_{223}$ vary in response to the variation of the first jitter current $I_{SCAN}$, the switching frequency is modulated in accordanly.

Figure 4:
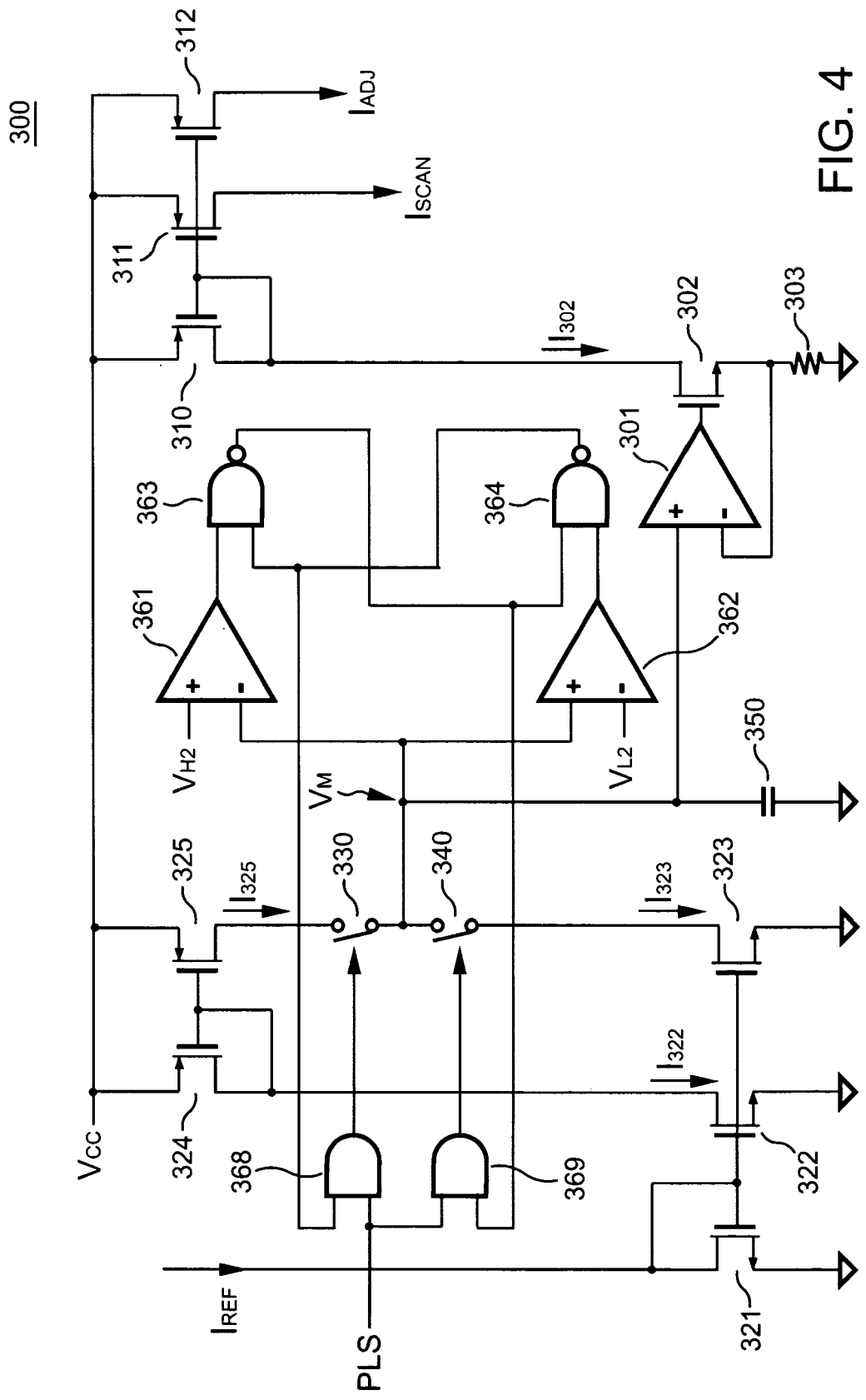
FIG. 4 shows an embodiment of a modulator according to the present invention.

FIG. 4 shows a circuit schematic of the modulator 300. Transistors 321, 322 and 323 form a fifth current mirror. The reference current $I_{REF}$ drives the fifth current mirror to generate a current $I_{322}$ and a current $I_{323}$. Transistors 324 and 325 form a sixth current mirror. The current $I_{322}$ further drives the sixth current mirror to generate a current $I_{325}$ via the transistor 325. The current $I_{325}$ is applied to charge a capacitor 350 through a switch 330, and the current $I_{323}$ is used to discharge the capacitor 350 through a switch 340.

A positive input of a comparator 361 is supplied with a threshold voltage $V_{H2}$. A negative input of a comparator 362 is supplied with a threshold voltage $V_{L2}$. A negative input of the comparator 361 and a positive input of the comparator 362 are connected to the capacitor 350. The threshold voltage $V_{H2}$ is higher than the threshold voltage $V_{L2}$. An output of the comparator 361 is connected to a first input of a NAND gate 363. An output of the comparator 362 is connected to a first input of a NAND gate 364. An output of the NAND gate 363 is connected to a second input of the NAND gate 364 and a first input of an AND gate 369. An output of the NAND gate 364 is connected to a second input of the NAND gate 363 and a first input of an AND gate 368. A second input of the AND gate 368 and a second input of the AND gate 369 are both supplied with the pulse signal PLS. An output of the AND gate 368 is connected to a control terminal of the switch 330. An output of the AND gate 369 is connected to a control terminal of the switch 340. The output of the NAND gate 363 controls the switch 340 via the AND gate 369. The output of the NAND gate 364 controls the switch 330 via the AND gate 368. When a modulation voltage $V_M$ across the capacitor 350 exceeds the threshold voltage $V_{H2}$, the switch 330 will be turned off and the switch 340 will be turned on for discharging the capacitor 350. Once the modulation voltage $V_M$ is lower than the threshold voltage $V_{L2}$, the next oscillation cycle will be started again.

Figure 6:
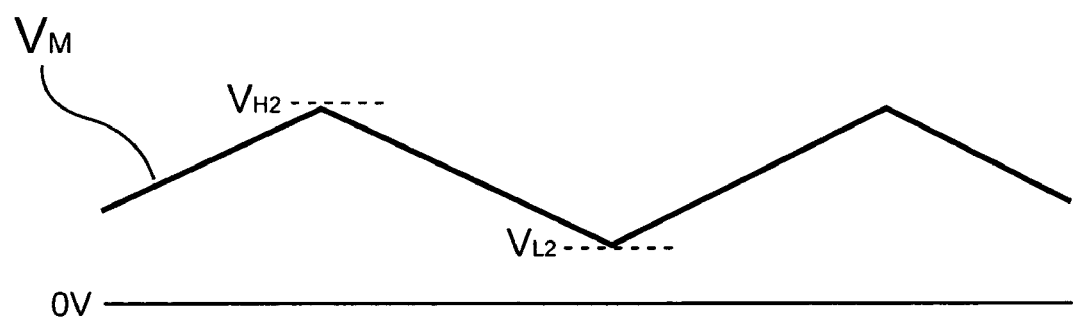
FIG. 6 shows the waveform of the modulator.

FIG. 6 shows the waveform of the modulation voltage $V_M$. The modulation voltage $V_M$ is normally oscillated in a low frequency such as 4~8 KHz. A higher capacitance of the capacitor 350 is thus needed for the charging and the discharging. However, since the second input of the AND gates 368 and the second input of the AND gate 369 are both supplied with the pulse signal PLS, both the charge and the discharge of the capacitor 350 are enabled only during a logic-high period of the pulse signal PLS. Therefore, the capacitance and the size of the capacitor 350 can be reduced. No complicated circuit or counter is needed.

An operational amplifier 301, a transistor 302 and a resistor 303 form a second V-to-I circuit. The modulation voltage $V_M$ is further supplied to a positive input of the operational amplifier 301. The second V-to-I circuit generates a current $I_{302}$ in response to the modulation voltage $V_M$. Transistors 310, 311 and 312 form a seventh current mirror. The current $I_{302}$ further drives the seventh current mirror to generate the first jitter current $I_{SCAN}$ and the second jitter current $I_{ADJ}$. Both the first jitter current $I_{SCAN}$ and the second jitter current $I_{ADJ}$ are modulated in response to the oscillation of the modulation voltage $V_M$.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A PWM controller having frequency jitter, comprising:
  a modulator, for generating a first jitter current and a second jitter current; wherein said first jitter current is proportional to said second jitter current;
  an oscillator, for generating a pulse signal to determine a switching frequency in response to the modulation of said first jitter current; wherein said switching frequency increases whenever said first jitter current increases, and vice versa;
  an attenuator, connected in a voltage feedback loop, for attenuating a feedback signal to an attenuated feedback signal, wherein said attenuated feedback signal is utilized to control an on-time of a switching signal; wherein said on-time of said switching signal and an output power of a power supply are proportional to a magnitude of said feedback signal;
  a variable-resistance circuit comprising an output connected to said attenuator, for programming an attenuation rate of said attenuator in response to the modulation of said second jitter current; wherein said on-time of said switching signal decreases whenever said second jitter current increases, and vice versa;
  a first comparator, for generating a first reset signal, wherein a positive input of said first comparator is supplied with said attenuated feedback signal, and a negative input of said first comparator is supplied with a switching-current signal;
  a second comparator, for generating a second reset signal for over-current protection, wherein a positive input of said second comparator is supplied with a first threshold voltage, wherein a negative input of said second comparator is supplied with said switching-current signal;
  a first AND gate, having two inputs for receiving said first reset signal and said second reset signal;
  a D flip-flop, for generating a PWM signal, wherein said D flip-flop is set by said pulse signal and is reset by an output of said first AND gate;
  a current source, for pulling up said feedback signal;
  an inverter, having an input supplied with said pulse signal; and
  a second AND gate, for generating said switching signal, wherein a first input of said second AND gate is supplied with said PWM signal, wherein a second input of said second AND gate is connected to an output of said inverter, wherein said switching signal is utilized to control the switching of the power supply.

2. The PWM controller having frequency jitter of claim 1, wherein said variable-resistance circuit comprising:
  an operational amplifier;
  a left transistor; and
  a right transistor, wherein a negative input of said operational amplifier is supplied with a second reference voltage; wherein said second jitter current is supplied to a positive input of said operational amplifier and a drain of said left transistor; wherein sources of said left transistor and said right transistor are connected to a ground reference level; wherein gates of said left transistor and said right transistor are controlled by an output of said operational amplifier; wherein a drain of said right transistor is said output of said variable-resistance circuit, which is connected with said attenuator for programming said attenuation rate of said attenuator.

3. The PWM controller having frequency jitter of claim 1, wherein said oscillator comprising:
  a first V-to-I circuit, formed by a first VI operational amplifier, a first VI transistor, a first VI resistor, wherein said first V-to-I circuit generates a VI constant current;
  a first current mirror, for generating a reference current and a first osc-charge current by mirroring said VI constant current;
  a second current mirror, for generating a first osc-discharge current by mirroring said VI constant current;
  a third current mirror, for generating a second osc-discharge current by mirroring said first jitter current;
  a fourth current mirror, for generating a second osc-charge current by mirroring said first jitter current;
  an osc-charge switch;
  an osc-discharge switch;
  an osc capacitor, wherein said first osc-charge current and said second osc-charge current charge said osc capacitor through said osc-charge switch; wherein said first osc-discharge current and said second osc-discharge current discharge said osc capacitor through said osc-discharge switch;
  a third comparator, wherein a positive input of said third comparator is supplied with an first osc-threshold voltage;
  a fourth comparator, wherein a negative input of said fourth comparator is supplied with a second osc-threshold voltage; wherein said first osc-threshold voltage is higher than said second osc-threshold voltage;
  a first NAND gate, for outputting said pulse signal and turning on/off said osc-discharge switch, wherein a first input of said first NAND gate is driven by an output of said third comparator, wherein an output of said first NAND gate is connected to a control terminal of said osc-discharge switch; and
  a second NAND gate, for turning on/off said osc-charge switch, wherein two inputs of said second NAND gate are respectively connected to said output of said first NAND gate and an output of said fourth comparator; wherein an output of said second NAND gate is connected to a second input of said first NAND gate and a control terminal of the osc-charge switch.

4. The PWM controller having frequency jitter of claim 1, wherein said modulator comprising:
  a fifth current mirror, for receiving said reference current and generating a mod-discharge current;
  a sixth current mirror, for generating a mod-charge current by mirroring said reference current;
  a mod-charge switch;
  a mod-discharge switch;
  a third AND gate, for turning on/off said mod-charge switch;
  a fourth AND gate, for turning on/off said mod-discharge switch;
  a mod capacitor, for holding a modulation voltage, wherein said mod capacitor is charged by said mod-charge current via said mod-charge switch and is discharged by said mod-discharge current via said mod-discharge switch;
  a fifth comparator, wherein a positive input of said fifth comparator is supplied with a first mod-threshold voltage;
  a sixth comparator, wherein a negative input of said sixth comparator is supplied with a second-mod threshold voltage, wherein said first mod-threshold voltage is higher than said second mod-threshold voltage;

a third NAND gate, having an output connecting to a first input of said fourth AND gate; wherein said fourth AND gate has a second input supplied with said pulse signal; wherein a first input of said third NAND gate is connected to an output of said fifth comparator;

a fourth NAND gate, having an output connecting to a first input of said third AND gate and a second input of said third NAND gate; wherein a second input of said third AND gate is supplied with said pulse signal; wherein a first input of said fourth NAND gate is connected to an output of said sixth comparator; wherein a second input of said fourth NAND gate is connected to said output of said third NAND gate, a second V-to-I circuit, formed by an second VI operational amplifier, a second VI transistor and a second VI resistor, wherein said second V-to-I circuit generates a modulation current in response to said modulation voltage; and a seventh current mirror, for generating said first jitter current and said second jitter current by mirroring said modulation current.

5. A PWM controller, comprising:

a modulator, for generating a first jitter current and a second jitter current;

an oscillator, for generating a pulse signal to determine a switching frequency in response to the modulation of said first jitter current;

an attenuator, connected to a feedback input of said PWM controller for attenuating a feedback signal to an attenuated feedback signal; and a variable-resistance circuit, having an output connected to said attenuator for programming an attenuation rate of said attenuator.

6. The PWM controller of claim 5, further comprising a first comparator connected to said attenuator for generating a first reset signal and a second comparator connected to a current-sense input of said PWM controller for generating a second reset signal for over-current protection.

7. The PWM controller of claim 6, further comprising a first AND gate having two inputs for receiving said first reset signal and said second reset signal.

8. The PWM controller of claim 7, further comprising a D flip-flop for generating a PWM signal, wherein said D flip-flop is set by said pulse signal and is reset by an output of said first AND gate.

9. The PWM controller of claim 8, further comprising a current source connected to said feedback input of said PWM controller for pulling up said feedback signal.

10. The PWM controller of claim 9, further comprising an inverter having an input supplied with said pulse signal.

11. The PWM controller of claim 10, further comprising a second AND gate for generating a switching signal, wherein a first input of said second AND gate is supplied with said PWM signal, wherein a second input of said second AND gate is connected to an output of said inverter, wherein said switching signal is utilized to control the switching of a power supply.

12. The PWM controller of claim 5, wherein said first jitter current is proportional to said second jitter current.

13. The PWM controller of claim 5, wherein said switching frequency increases whenever said first jitter current increases, and vice versa, wherein said switching frequency has a jittering operation in response to said first jitter current.

14. The PWM controller of claim 5, wherein said attenuated feedback signal is utilized to control an on-time of a switching signal, and wherein said on-time of said switching signal and an output power of a power supply are proportional to a magnitude of said feedback signal.

15. The PWM controller of claim 5, wherein said variable-resistance circuit is adapted for programming an attenuation rate of said attenuator in response to the modulation of said second jitter current, and wherein an on-time of a switching signal decreases whenever said second jitter current increases, and vice versa.

16. The PWM controller of claim 6, wherein a positive input of said first comparator is supplied with said attenuated feedback signal, and a negative input of said first comparator is connected to said current-sense input of said PWM controller for receiving a switching-current signal, wherein said switching-current signal is obtained from said current-sense input of said PWM controller.

17. The PWM controller of claim 16, wherein a positive input of said second comparator is supplied with a first threshold voltage; wherein a negative input of said second comparator is supplied with said switching-current signal.

* * * * *